United States Patent
Aliane et al.

(10) Patent No.: US 10,056,542 B2
(45) Date of Patent: Aug. 21, 2018

(54) PIEZOELECTRIC DEVICE

(71) Applicant: Commissariat à l'Energie Atomique et aux Energies Alternatives, Paris (FR)

(72) Inventors: Abdelkader Aliane, Grenoble (FR); Mohammed Benwadih, Champigny sur Marne (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 358 days.

(21) Appl. No.: 15/076,942

(22) Filed: Mar. 22, 2016

(65) Prior Publication Data

US 2016/0284978 A1   Sep. 29, 2016

(30) Foreign Application Priority Data

Mar. 24, 2015 (FR) ...................... 15 52434

(51) Int. Cl.
| | |
|---|---|
| *H01L 41/193* | (2006.01) |
| *H01L 41/45* | (2013.01) |
| *H04R 17/00* | (2006.01) |
| *H04R 7/12* | (2006.01) |
| *H04R 31/00* | (2006.01) |
| *H01L 41/047* | (2006.01) |

(52) U.S. Cl.
CPC ............ *H01L 41/193* (2013.01); *H01L 41/45* (2013.01); *H04R 7/125* (2013.01); *H04R 17/00* (2013.01); *H04R 31/00* (2013.01); *H01L 41/047* (2013.01); *H01L 41/0478* (2013.01); *H04R 2307/029* (2013.01)

(58) Field of Classification Search
CPC ... H01L 41/193; H01L 41/45; H01L 41/0471; H01L 41/047; H01L 41/0475
USPC .......................... 310/328, 364, 365, 366, 800
See application file for complete search history.

(56) References Cited

U.S. PATENT DOCUMENTS

| | | |
|---|---|---|
| 5,582,757 A | 12/1996 | Kio et al. |
| 6,081,182 A | 6/2000 | Tomozawa et al. |
| 2008/0246025 A1* | 10/2008 | Nomura ............... H01L 27/1214 257/40 |
| 2012/0161587 A1* | 6/2012 | Kim ........................ G06F 3/016 310/364 |

(Continued)

FOREIGN PATENT DOCUMENTS

GB     1287930 A     9/1972

OTHER PUBLICATIONS

Search Report filed in FR 15/52607, dated Jan. 15, 2016, 2 pgs.

(Continued)

*Primary Examiner* — Bryan Gordon
(74) *Attorney, Agent, or Firm* — Moreno IP Law LLC

(57) ABSTRACT

A piezoelectric device including a paper film including cellulose fibers and containing an additive selected from the group including 4-fluorophenethyl isocyanate, 2-2 diphenyl-ethyl isocyanate, nitrophenyl isocyanate, 1-adamantyl isocyanate, cyanophenyl isocyanate, and triphenylamine grafted to the cellulose fibers, the film further having a first surface and a second surface opposite to the first surface and a first electrode arranged on the first surface and a second electrode arranged on the second surface.

10 Claims, 3 Drawing Sheets

(56) References Cited

U.S. PATENT DOCUMENTS

| | | | |
|---|---|---|---|
| 2012/0314007 A1* | 12/2012 | Shimofuku | B41J 2/161 347/71 |
| 2015/0023393 A1* | 1/2015 | Britton | G01K 7/24 374/185 |
| 2015/0321908 A1 | 11/2015 | Wagner et al. | |
| 2016/0001556 A1* | 1/2016 | Masuda | B41J 2/14201 347/71 |

OTHER PUBLICATIONS

International Search Report filed in FR 15/52434, dated Feb. 15, 2016, 3 pgs.

"Characteristics and Performance of Electroactive Paper Actuator Made with Cellulose/Polyurethan Semi-Interpenetrating Polymer Networks"; Cai Zhijiang, et al.; Journal of Applied Polymer Science; vol. 109, No. 6; Sep. 15, 2008; 6 pgs.

"Electrical and Electromechanical Properties of Cellulose-Polypyrrole-Ionic Liquid Nanocomposite: Effect of Polymerization Time"; Suresha K. Mahadeva, et al.; IEEE Transactions of Nanotechnology; vol. 10, No. 3; May 1, 2011; 5 pgs.

"The Preparation, Characterization and Actuation Behavior of Polyaniline and Cellulose Blended Electro-Active Paper"; John Amalraj, et al.; Smart Materials and Structures; vol. 19, No. 4; Apr. 1, 2010; 6 pgs.

"Characteristics and Bending Performance of Electroactive Polymer Blend Made with Cellulose and Poly (3-Hydroxybutyrate)"; Cai Zhijiang, et al.; Carbohydrate Polymers, Applied Science Publishers, Ltd; vol. 87, No. 1; Aug. 16, 2011; 7 pgs.

"Cellulose Electro-Active Paper: From Discovery to Technology Applications"; Zafar Abas, et al.; Frontiers in Materials; Sep. 30, 2014; vol. 1, Article 17; 4 pgs.

\* cited by examiner

PIEZOELECTRIC DEVICE

CROSS-REFERENCE TO RELATED APPLICATION

The instant application is related to U.S. patent application Ser. No. 15/079,956 filed on Mar. 24, 2016. Additionally, this application claims the priority benefit of French patent application number 15/52434, filed on Mar. 24, 2015, the content of which is hereby incorporated by reference in its entirety to the maximum extent allowable by law.

BACKGROUND

The present disclosure relates to a piezoelectric device based on organic materials and to a method of manufacturing such a device.

DISCUSSION OF THE RELATED ART

U.S. Pat. No. 8,680,741 describes a sensor comprising a paper film having piezoelectric properties. Electrodes, arranged on the surfaces of the paper, enable to apply a voltage to the paper film.

A disadvantage of the sensor described in this patent is that the paper film used should be of the type comprising cellulose fibers substantially directed along a preferred direction and that the electrodes should be directed with a 45° angle relative to the cellulose fibers to obtain a maximum piezoelectric effect.

It would be desirable to be able to form a device comprising a paper film having piezoelectric properties independent from the electrode direction relative to the cellulose fibers of the paper film. Further, it would be desirable to be able to form a paper film having piezoelectric properties and having cellulose fibers with no preferred direction, particularly a paper film comprising cellulose platelets.

SUMMARY

An embodiment overcomes all or part of the disadvantages of previously-described piezoelectric devices comprising a paper film having piezoelectric properties.

An embodiment provides a piezoelectric device manufacturable at low cost.

An embodiment provides that the piezoelectric device may be formed, at least partly, by printing techniques.

Thus, an embodiment provides a piezoelectric device comprising:

a paper film comprising cellulose fibers and containing an additive selected from the group comprising 4-fluorophenethyl isocyanate, 2-2 diphenylethyl isocyanate, nitro-phenyl isocyanate, 1-adamantyl isocyanate, cyanophenyl iso-cyanate, and triphenylamine grafted to the cellulose fibers, the film further having a first surface and a second surface opposite to the first surface; and a first electrode arranged on the first surface and a second electrode arranged on the second surface.

According to an embodiment, the device further comprises:

a piezoelectric layer extending on the first electrode; and
a third electrode, the piezoelectric layer being interposed between the first electrode and the third electrode.

According to an embodiment, the piezoelectric layer comprises polyvinylidene fluoride and/or at least one copolymer of polyvinylidene fluoride, particularly a polymer selected from the group comprising polyvinylidene fluoride, poly(vinylidene fluoride-trifluoro ethylene), poly(vinylidene fluoride-tetra fluoro ethylene), and a mixture of at least two of these polymers.

According to an embodiment, the device further comprises a first coating between the first surface and the first electrode and a second coating between the second surface and the second electrode.

According to an embodiment, the first coating and/or the second coating comprise a material selected from the group comprising 3-aminopropyl trimethyloxysilane, polyimides, and poly(N-isopropylacrylamide).

According to an embodiment, the first electrode and/or the second electrode comprise through openings.

Another embodiment provides a method of manufacturing a piezoelectric device, comprising the steps of:
(a) providing a paper film comprising cellulose fibers and having a first surface and a second surface, opposite to the first surface;
(b) dipping the paper film into a solution comprising at least one additive selected from the group comprising 4-fluorophenethyl isocyanate, 2-2 diphenylethyl isocyanate, nitrophenyl isocyanate, 1-adamantyl isocyanate, cyanophenyl iso-cyanate, and triphenylamine;
(c) grafting the additive to the cellulose fibers; and
(d) forming a first electrode on the first surface and a second electrode on the second surface.

According to an embodiment, step c) comprises exposing the paper film to pulses of an ultraviolet radiation.

According to an embodiment, the pulses have a duration in the range from 0.5 to 2 ms and an energy fluence in the range from 5 to 20 J/cm$^2$.

According to an embodiment, the method further comprises the steps of:
(a) forming a layer comprising a solvent and polyvinylidene fluoride and/or at least one copolymer of polyvinylidene fluoride, particularly a polymer selected from the group comprising polyvinylidene fluoride, poly(vinylidene fluoride-tri fluoro ethylene), poly(vinylidene fluoride-tetra fluoro ethylene), and a mixture of at least two of these polymers;
(b) exposing the layer to pulses of an ultraviolet radiation.

The foregoing and other features and advantages will be discussed in detail in the following non-limiting description of specific embodiments in connection with the accompanying drawings.

DETAILED DESCRIPTION

Figure 1:
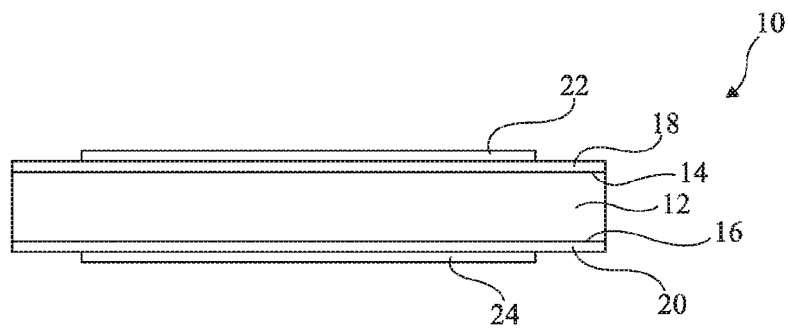
FIG. 1 is a partial simplified cross-section view of an embodiment of a piezoelectric device.

The same elements have been designated with the same reference numerals in the different drawings and, further, the various drawings are not to scale. For clarity, only those elements which are useful to the understanding of the described embodiments have been shown and are detailed. In particular, the piezoelectric control devices are well known by those skilled in the art and are not described in detail. Unless otherwise specified, expressions "approximately", "substantially", and "in the order of" mean to within 10%, preferably to within 5%. In the following description, expression element "based on polyvinylidene fluoride (PVDF)" means a copolymer comprising at least 70% by molar mass of the vinylidene fluoride monomer (VDF) and possibly of at least another monomer such as, for example, trifluoroethylene (TrFE) or tetrafluoroethylene (TFE).

Embodiments of a piezoelectric device adapted to the forming of a speaker will be described. It should however be clear that the piezoelectric device may be used for other applications, for example, to form a sensor, particularly a pressure sensor, or a power recovery device.

FIG. 1 shows an embodiment of a piezoelectric device 10. Piezoelectric device 10 comprises a paper film 12 having two opposite surfaces 14, 16. A coating 18 covers surface 14 and is in contact with surface 14, and a coating 20 covers surface 16 and is in contact with surface 16. A first electrode 22 covers coating 18 and is in contact with coating 18, and a second electrode 24 covers coating 20 and is in contact with coating 20. At least a portion of electrode 22 is opposite at least a portion of electrode 24. In the shown embodiment, the entire surface of electrode 22 in contact with coating 18 is opposite the surface of electrode 24 in contact with coating 20.

The thickness of paper film 12 may be in the range from 50 to 300 μm, for example, equal to 200 μm. Paper film 12 may be a flexible film having a flexible behavior, that is, it may, under the action of an external force, deform, and particularly bend, without breaking or tearing. Paper film 12 is, for example, a paper film commercialized under trade name PowerCoat by Arjowiggins.

Paper film 12 comprises at least 40% by weight, preferably more than 50% by weight, more preferably more than 60% by weight of cellulose fibers. The cellulose fibers of paper film 12 may have a preferred direction. As a variation, the cellulose fibers may be assembled in cellulose fiber platelets. Term "wafer" designates a three-dimensional structure included in a cuboid having two sides, called major dimensions, with a length in the range from 5 nm to 2.5 μm, preferably from 50 nm to 2.5 μm, and greater than 5 times, preferably greater than 10 times, the third side length, called minor dimension, which may be in the range from 100 nm to 1 μm. The orientations of the cellulose fibers may be different from one wafer to the other.

Paper film 12 further comprises additives grafted to the cellulose fibers. The additive is selected from the group comprising 4-fluorophenethyl isocyanate, 2-2 diphenylethyl isocyanate, nitrophenyl isocyanate, 1-adamantyl isocyanate, cyanophenyl isocyanate, and triphenylamine. Paper film 12 may comprise from 0.1 to 10% by weight of the additive.

Each coating 18, 20 particularly favors the bonding of electrodes 22, 24 to paper film 12. Each coating 18, 20 may correspond to a layer having a thickness in the range from 100 nm to 300 nm, particularly approximately 200 nm. The inventors have shown that the piezoelectric effect is increased when the humidity absorption by paper film 12 is increased. To achieve this, according to an embodiment, each coating 18, 20 may be made of a material having a strong affinity for water, for example, a material selected from the group comprising 3-aminopropyl trimethyloxysilane, polyimides, or poly(N-isopropylacrylamide) (polyNIPAM).

Each electrode 22, 24 may be made of indium tin oxide, of a metallic material, particularly silver, gold, nickel, palladium, platinum, aluminum, copper, titanium, or an alloy or mixture of at least two of these materials, of a conductive polymer, for example, poly(3,4-ethylenedioxythiophene): poly(styrene sulfonate) (PEDOT:PSS) or of graphene. The thickness of each electrode 22, 24 may be in the range from 10 to 300 nm, for example, approximately 100 nm.

The inventors have shown that the piezoelectric effect is increased when the humidity absorption by paper film 12 is increased. To achieve this, according to an embodiment, each electrode 22, 24 may be covered with a layer, not shown in FIG. 1, of a material having a strong 2,2'-(ethylenedioxy)diethanethiol, hexa(ethylene glycol)dithiol, tetra(ethylene glycol)dithiol, (11-mercaptoundecyl)tetra(ethylene glycol), (11-mercaptoundecyl)hexa(ethylene glycol), and triethylene glycol mono-11-mercaptoundecyl ether.

According to an embodiment, the material forming each electrode 22, 24 is a porous material. This enables to increase the surface area of exchange between paper film 12 and the atmosphere through electrodes 22, 24 to increase the absorption of water by paper film 12.

Figure 2:
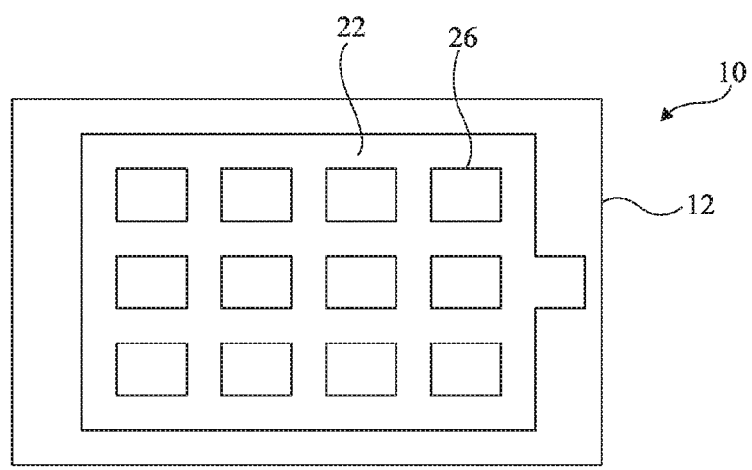
FIG. 2 is a partial simplified top view of another embodiment of a piezoelectric device.

FIG. 2 is a top view of an embodiment of piezoelectric device 10 where electrode 22, 24 comprises through openings 26 to increase the surface area of exchange between paper film 12 and the atmosphere to increase the absorption of water by paper film 12. Each through opening 26 may have, in top view, a rectangular shape, with a large side which may be in the range from 1 μm to 100 μm.

According to another embodiment, each opening 26 may contain a hydrophilic and/or porous material, which favors the absorption of humidity. According to an embodiment, each electrode 22, 24 is made of graphene and openings 26 may contain graphene oxide.

Figure 3:
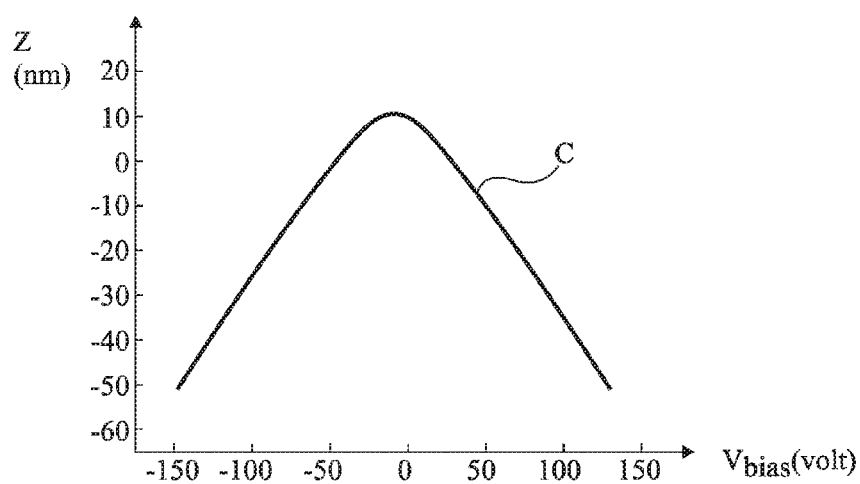
FIG. 3 shows a curve of variation of the deformation of the piezoelectric device of FIG. 1 according to the voltage applied to the device.

FIG. 3 shows a curve C of variation of maximum displacement z of paper film 12 according to the voltage $V_{bias}$ applied between electrodes 22 and 24. Cure C highlights the piezoelectric properties of paper film 12. Curve C has been obtained with a piezoelectric device 10 having the following characteristics:

paper film 12 sold under trade name PowerCoat by Arjowiggins, having a 200-μm thickness containing 4-fluorophenethyl isocyanate;

polyimide coating 18, 20; and silver electrodes 22, 24 having a 8-μm thickness.

Figure 4:
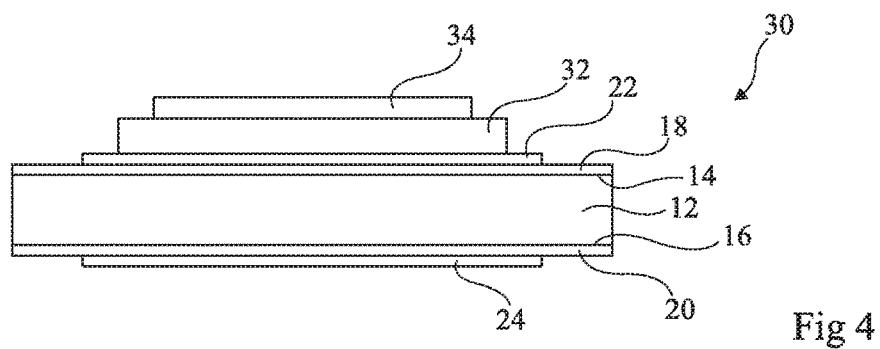
FIGS. 4 and 5 are partial simplified cross-section views of other embodiments of a piezoelectric device.

FIG. 4 is a cross-section view of another embodiment of a piezoelectric device 30. Piezoelectric device 30 comprises all the elements of piezoelectric device 10 shown in FIG. 1 and further comprises a piezoelectric layer 32 resting on electrode 22 and in contact with electrode 22 and a third electrode 34 resting on piezoelectric layer 32, on the side of piezoelectric layer 32 opposite to electrode 22, and in contact with piezoelectric layer 32.

Piezoelectric layer 32 may be made of a PVDF-based compound. The PVDF-based compound may comprise the PVDF polymer alone, a single copolymer of PVDF, a mixture of two or more than two copolymers of PVDF, a mixture of the PVDF polymer and of at least one copolymer of PVDF. Preferably, the PVDF copolymer is poly(vinylidene fluoride-trifluoro ethylene) (P(VDF-TrFE)), particularly $P(VDF_x\text{-}TrFE_{100-x})$ where x is a real number between 60 and 80, particularly approximately 70, poly(vinylidene fluoride-tetrafluoro ethylene), poly((vinylidene fluoride-trifluoroethylene-chlorofluoroethylene) (P(VDF- TrFE-CFE), or poly((vinylidene fluoride-trifluoroethylene-chlorotrifluoro ethylene) (P(VDF-TrFE-CTFE). Preferably, piezoelectric layer 32 is made of P(VDF-TrFE). According to an embodiment, piezoelectric layer 32 comprises more than 25% by mol of PVDF or of the PVDF copolymer. The molar mass of the PVDF polymer or of the PVDF copolymer is greater than or equal to 415,000 g/mol.

The PVDF-based compound may further comprise fillers. The fillers may correspond to ceramic particles, for example, baryum titanate particles ($BaPiO_3$), lead zirconate titanate particles ($PbZrTiO_3$ or PZT), lead titanate particles ($PbTiO_3$), or lithium tantalate particles ($LiTaO_3$). The concentration by weight of fillers in the PVDF-based compound may vary from 5% to 25%.

The compound may thus comprise a mixture of the PVDF polymer and of at least one ceramic or a mixture of at least one copolymer of PVDF and of at least one ceramic, for example, the following mixtures: PVDF/$BaTiO_3$, P(VDF-TrFE)/$BaTiO_3$, P(VDF-TrFE-CTFE)/$BaTiO_3$, P(VDF-TrFE-CFE)/$BaTiO_3$, PVDF/$PbZrTiO_3$, P(VDF-TrFE)/$PbZrTiO_3$, P(VDF-TrFE-CTFE)/$PbZrTiO_3$, P(VDF-TrFE-CFE)/$PbZrTiO_3$, PVDF/$PbTiO_3$, P(VDF-TrFE)/$PbTiO_3$, P(VDF-TrFE-CTFE)/$PbTiO_3$, P(VDF-TrFE-CFE)/$PbTiO_3$, PVDF/$LiTaO_3$, P(VDF-TrFE)/$LiTaO_3$, P(VDF-TrFE-CTFE)/$LiTaO_3$, P(VDF-TrFE-CFE)/$LiTaO_3$.

Electrode 34 may be formed with the same material as electrode 24. Electrode 22 may be made of a material different from the material of electrodes 24 and 34.

Preferably, electrode 22 of piezoelectric device 30 is at least partly made of an electrically-conductive carbon material. A carbon material is a material comprising more than 80%, preferably more than 90%, by weight of carbon. The carbon material may correspond to the product obtained after the drying of a carbon ink or may correspond to conductive graphene or to a mixture of carbon black and of a silver ink. The carbon ink may be the carbon ink commercialized by Creative Materials under reference 112-48. Preferably, electrode 22 is at least partly made of graphene. Preferably, the carbon material has a Young's modulus smaller than 10 GPa.

According to an embodiment, electrode 34 comprises silver nanowires or nanotubes. Each silver nanowire or nanotube may have a length in the range from 1 μm to 10 μm, preferably from 4 μm to 5 μm. The diameter of each silver nanowire or nanotube may be in the range from 10 nm to 200 nm, preferably from 60 nm to 100 nm.

According to an embodiment, in operation, piezoelectric paper film 12 and piezoelectric layer 32 may be connected in parallel with a voltage source, that is, electrode 22 is connected to a first terminal of the voltage source and electrodes 24 and 34 are connected to a second terminal of the voltage source.

Figure 5:
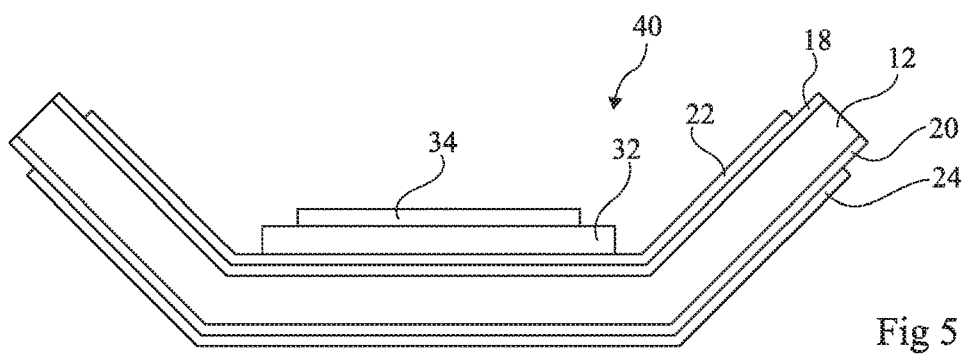

FIG. 5 is a cross-section view similar to FIG. 4 of another embodiment of a piezoelectric device 40. Piezoelectric device 40 comprises all the elements of piezoelectric device 30 shown in FIG. 4. Further, paper film 12 has been deformed to adopt a three-dimensional shape. The shape of paper film 12 may be adapted to the provided use of piezoelectric device 40. As an example, in the case where piezoelectric device 40 is used as a speaker, paper film 12 may be shaped to further play the role of a sounding box.

According to an embodiment, paper film 12 may be in the form of a spectacle frame, speakers being provided on the branches of the frame close to the ears.

Figure 6A:
FIGS. 6A to 6C are partial simplified cross-section views of the structures obtained at successive steps of another embodiment of a method of manufacturing the piezoelectric device shown in FIG. 1.
Figure 6B:
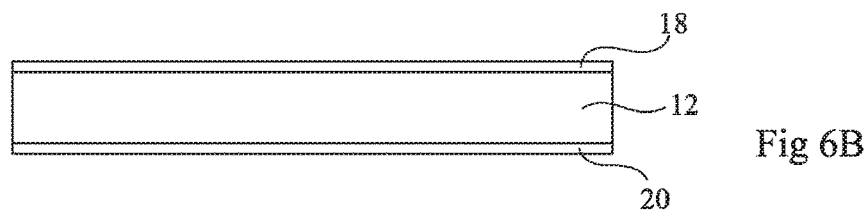
Figure 6C:
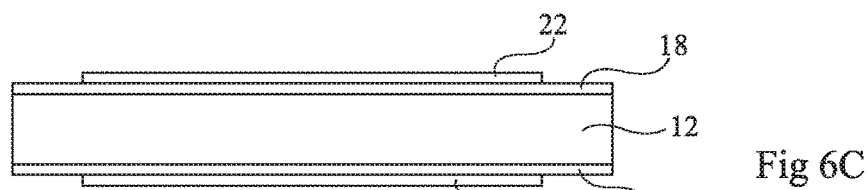

FIGS. 6A to 6C illustrate an embodiment of a method of manufacturing the piezoelectric device shown in FIG. 1.

FIG. 6A shows the structure obtained after having performed a treatment to graft to the cellulose fibers of paper film 12 at least one additive selected from the group comprising 4-fluorophenethyl isocyanate, 2-2 diphenylethyl isocyanate, nitrophenyl isocyanate, 1-adamantyl isocyanate, cyanophenyl isocyanate, and triphenylamine.

According to an embodiment, the treatment comprises the successive steps of:

dipping film 12 into a solution comprising a solvent and the additive so that the additive penetrates into the entire bulk of paper film 12;

drying film 12, for example, in free air, to evaporate the solvent; and grafting or bonding the additive to the cellulose fibers of film 12, for example, by exposing film 12 to an ultraviolet radiation (UV), by a succession of UV radiation pulses, or ultraviolet flashes.

As an example, the solvent is toluene, acetone, isopropanol, xylene, or chloroform. The solution may comprise from 5% to 20%, preferably 15%, by weight of the additive. The film is dipped, for example, for between 30 seconds and 5 minutes, in particular approximately 1 minute, into the solution. UV radiation means a radiation having its wavelengths at least partly in the range from 200 nm to 400 nm. Each UV radiation for example has a duration in the range from 0.5 to 2 ms, and an energy fluence in the range from 5 to 30 $J/cm^2$, in particular approximately 20 $J/cm^2$. The number of UV pulses may vary from 1 to 5 pulses. The duration between two successive pulses may vary from 1 to 5 seconds. The pulses may be emitted by means of the equipment commercialized under trade name PulseForge by Novacentrix or under trade name Sinteron 2000 by Xenon Corporation. The exposure of paper film 12 to UV pulses enables to obtain a grafting of the additive to the cellulose fibers without causing to significant evaporation of the water contained in paper film 12.

FIG. 6B shows the structure obtained after having formed coatings 18 and 20 on surfaces 14 and 16 of paper film 12. Coatings 18, 20 may be deposited by spin coating, by inkjet printing, or by sputtering. The drying of the deposited material may be achieved by exposure to a UV radiation. The UV radiations for example have a duration in the range from 0.5 to 2 ms and, for example, an energy fluence in the range from 5 to 20 $J/cm^2$, in particular approximately 15 $J/cm^2$. The number of UV pulses may vary from 1 to 15. The duration between two successive pulses may vary from 500 μs to 2 ms.

FIG. 6C shows the structure obtained after having formed electrodes 22, 24 on coatings 18, 20. According to the material forming electrodes 22, 24, the method of forming electrodes 22, 24 may correspond to a so-called additive process, for example, by direct printing of a fluid or viscous composition comprising the material forming electrodes 22, 24 at the desired locations, for example, by inkjet printing, heliography, silk-screening, flexography, spray coating, or drop-casting. According to the material forming electrodes 22, 24, the method of forming electrodes 22, 24 may correspond to a so-called subtractive process, where the material forming electrodes 22, 24 is deposited over the entire structure and where the non-used portions are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. According to the implemented deposition method, a step of drying the deposited materials may be provided.

When the forming of electrodes 22, 24 comprises a step of physical vapor deposition, the method comprises depositing a conductive layer on coating 18 or 20 and etching this layer to delimit electrodes 22, 24. The etching may comprise a photolithography step. As an example, in the case where electrodes 22, 24 are made of gold, the etching may be a chemical etching with potassium iodide.

According to an embodiment, the method of forming electrode 22 comprises the steps of:

depositing a graphene oxide layer over the entire surface 14, for example, by spin coating; and exposing portions of the graphene oxide layer to a UV radiation through a mask according to the desired shape of electrode 22 to decrease the graphene oxide and transform it into graphene.

The method may further comprise forming a polar layer having a strong affinity for water on each electrode 22, 24 according to one of the previously-described deposition methods.

FIGS. 7A to 7D illustrate an embodiment of a method of manufacturing piezoelectric device 30 or 40 shown in FIGS. 4 and 5.

The initial steps of the method comprise the steps previously described in relation with FIGS. 6A and 6B.

Figure 7A:
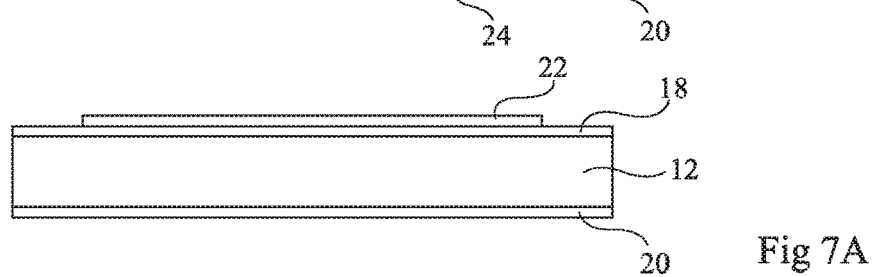
FIGS. 7A to 7D are partial simplified cross-section views of the structures obtained at successive steps of another embodiment of a method of manufacturing the piezoelectric device shown in FIG. 3 or 4.

FIG. 7A shows the structure obtained after having formed electrode 22 on coating 18. Electrode 22 may be formed as previously described in relation with FIG. 6C.

In the case where electrode 22 is made of a carbon material, the method may comprise depositing a liquid composition, possibly viscous, followed by a drying step to form electrode 22. The liquid composition comprises a solvent and a compound based on a carbon material dissolved in the solvent. The solvent may be selected from the group comprising cyclohexane, chloroform, tetrahydrofuran, ethyl acetate, and xylene. The composition may comprise from 5% to 30% by weight of the carbon compound and from 85% to 70% by weight of the solvent. Advantageously, the concentration by weight of the solvent is selected to adjust the viscosity of the obtained composition to enable to implement printing techniques. The method of forming electrode 22 may correspond to a so-called additive method such as previously described, particularly by inkjet, silk-screening, or spray coating, or to a so-called subtractive method, such as previously described. The step of drying the composition may comprise an anneal performed at a temperature in the range from 100° C. to 130° C. for from 10 minutes to 60 minutes.

Figure 7B:
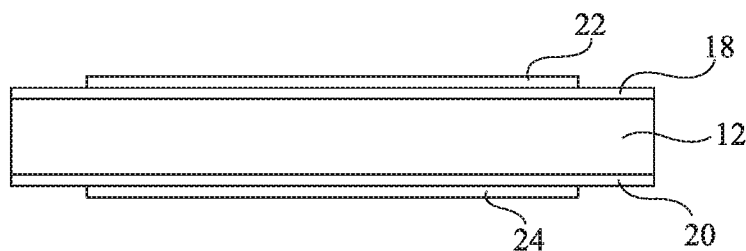

FIG. 7B shows the structure obtained after having formed electrode 24 on coating 20. Electrode 24 may be formed as previously described in relation with FIG. 6C. In the case where the materials forming electrodes 22 and 24 are different, the methods implemented to form these layers may be different.

Figure 7C:
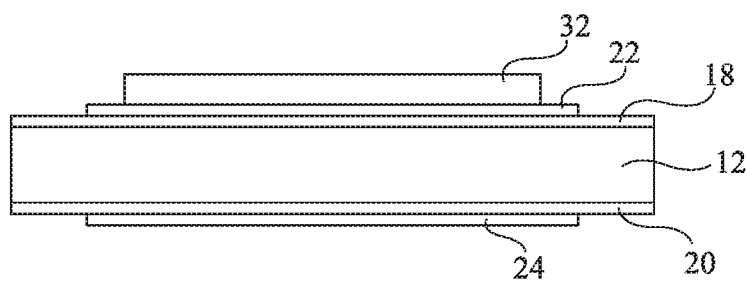

FIG. 7C shows the structure obtained after having formed piezoelectric layer 32 on electrode 22. The method may comprise depositing a liquid composition, possibly viscous, comprising a PVDF-based compound, followed by a method of crystallizing the PVDF-based compound to form piezoelectric layer 32.

The liquid composition comprises a solvent and a compound based on PVDF dissolved in the solvent. Preferably, the solvent is a polar solvent. This advantageously enables to improve the dissolution of the PVDF-based polymer. Preferably, the solvent is capable of absorbing, at least partially, the UV radiation, for example, over a wavelength range between 200 nm and 400 nm. According to an embodiment, the evaporation temperature of the solvent is in the range from 110° C. to 140° C., preferably from 110° C. to 130° C., more preferably from 120° C. to 130° C. The solvent may be selected from the group comprising cyclopentanone, dimethylsulphoxide (DMSO), dimethylformamide (DMF), dimethylacetamide (DMAc), or N-methyl-E-pyrrolidone (NMP). Preferably, the solvent is cyclopentanone.

The composition may comprise from 1% to 30%, preferably from 1% to 30%, preferably from 10% to 25%, in particular approximately 20%, by weight of the PVDF-based compound and from 70% to 99%, preferably from 75% to 90%, in particular approximately 80%, by weight of the solvent. Advantageously, the concentration by weight of the solvent is selected to adjust the viscosity of the obtained composition to enable to implement printing techniques. The method of forming piezoelectric layer 32 may correspond to a so-called additive method such as previously described, particularly by inkjet, silk-screening, or spray coating. The method of forming piezoelectric layer 32 may further correspond to a so-called subtractive method such as previously described. When the deposition method comprises a silk-screening step, the viscosity of the composition may vary from 5 Pa·s to 30 Pa·s.

The step of crystallizing the PVDF-based compound may comprise an anneal carried out at a temperature in the range from 100° C. to 130° C. for from 10 minutes to 30 minutes. According to another embodiment, the crystallization step may comprise a UV ray irradiation of the composition by a succession of UV radiation pulses, or ultraviolet flashes. According to an embodiment, the duration of a UV pulse is in the range from 500 µs to 2 ms. The duration between two successive UV pulses may be in the range from 1 to 5 seconds. The energy fluence of the UV radiation may be in the range from 10 J/cm$^2$ to 25 J/cm$^2$. The number of UV pulses particularly depends on the thickness of piezoelectric layer 32. As an example, for a 100-nm thickness of piezoelectric layer 32, the number of UV pulses may be in the range from 1 to 2 with an energy fluence between 10 J/cm$^2$ and 15 J/cm$^2$ and for a thickness of piezoelectric layer 32 in the order of 4 µm, the number of UV pulses may be in the range from 2 to 6 with an energy fluence between 17 J/cm$^2$ and 21 J/cm$^2$.

Advantageously, during the irradiation of the composition, electrode 22 reflects part of the UV radiation having crossed the composition. This enables to improve the quantity of UV radiation received by the composition. Advantageously, the solvent of the composition at least partly absorbs the UV radiation. This enables to improve the heating of the compound based on UVs and to favor the forming of crystal phase β, which is the phase capable of having piezoelectric properties. The evaporation temperature of the solvent is advantageously higher than 110° C. to avoid too fast an evaporation of the solvent before the forming of crystal phase β which occurs between 120° C. and 130° C. Preferably, the irradiation step causes an evaporation of more than 50% by weight, preferably of more than 80% by weight, of the solvent of the composition.

Figure 7D:
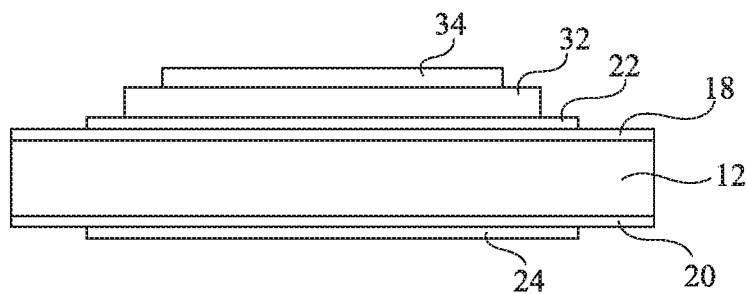

FIG. 7D shows the structure obtained after having formed electrode 34 on piezoelectric layer 32. Electrode 34 may be formed as previously described in relation with FIG. 6C.

According to an embodiment, electrode 34 may be formed from a solution of silver nanowires, for example, the solution commercialized by Henkel under trade name ECI 5003. The deposition of the solution of silver nanowires may be followed by an anneal, for example, at a temperature in the range from 90° C. to 120° C. Advantageously, the anneal temperature of electrode 34 causes no degradation of piezoelectric layer 32. It may be advantageous to form electrode 34 from an ink containing silver nanotubes, that is, silver particles having a mean diameter in the range from 1 nm to 5 nm. The mean diameter of a nanoparticle is defined as being the diameter of the sphere of same volume. Indeed, the step of annealing the nanoparticle ink layer should be implemented at a temperature higher than 180° C., that is, at a temperature causing a degradation of piezoelectric layer 32. It may be advantageous to form electrode 34 from an ink containing silver nanotubes, that is, silver particles having a mean diameter in the range from 2 µm to 4 µm. Indeed, the inventors have shown that electrode 34 obtained from an ink comprising silver flakes tends to crack, particularly when paper film 12 is deformed.

For certain applications, to improve the piezoelectric characteristics of piezoelectric layer 32 based on PVDF, a DC electric field may be applied to the piezoelectric layer with an intensity varying from 20 V/µm to 80 V/µm for a plurality of minutes at 25° C. or at a higher temperature, for example, between 60° C. and 100° C. According to another embodiment, the piezoelectric characteristics of layer 32 based on PVDF may be improved by applying a Corona treatment to piezoelectric layer 32.

Piezoelectric device 30 shown in FIG. 4 is obtained at the end of the steps previously described in relation with FIGS. 7A to 7D. To obtain piezoelectric device 40 shown in FIG. 5, the manufacturing method further comprises a step of shaping paper film 12. According to an embodiment, the shaping step comprises the punching of paper film 12.

Specific embodiments have been described. Various alterations, modifications, and improvements will occur to those skilled in the art. In particular, although in the previously described embodiments, piezoelectric device 30 and 40 comprises a single piezoelectric layer based on PVDF on a surface of paper film 12, it should be clear that the piezoelectric device may comprise a piezoelectric layer based on PVDF on each surface of paper film 12.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A piezoelectric device comprising:
  a paper film comprising cellulose fibers and containing an additive selected from the group comprising 4-fluorophenethyl isocyanate, 2-2 diphenylethyl isocyanate, nitrophenyl isocyanate, 1-adamantyl isocyanate, cyanophenyl isocyanate, and triphenylamine grafted to the cellulose fibers, the film further having a first surface and a second surface opposite to the first surface; and
  a first electrode arranged on the first surface and a second electrode arranged on the second surface.

2. The piezoelectric device of claim 1, further comprising:
  a piezoelectric layer extending on the first electrode; and
  a third electrode, the piezoelectric layer being interposed between the first electrode and the third electrode.

3. The piezoelectric device of claim 2, wherein the piezoelectric layer comprises polyvinylidene fluoride and/or at least one copolymer of polyvinylidene fluoride, particularly a polymer selected from the group comprising polyvinylidene fluoride, poly(vinylidene fluoride-tri fluoro ethylene), poly(vinylidene fluoride-tetra fluoro ethylene), and a mixture of at least two of these polymers.

4. The piezoelectric device of claim 1, further comprising a first coating between the first surface and the first electrode and a second coating between the second surface and the second electrode.

5. The piezoelectric device of claim 4, wherein the first coating and/or the second coating comprise a material selected from the group comprising 3-aminopropyl trimethyloxysilane, polyimides, and poly(N-isopropylacrylamide).

6. The piezoelectric device of claim 1, wherein the first electrode and/or the second electrode comprise through openings.

7. A method of manufacturing an optoelectronic device, comprising the steps of:
  a) providing a paper film comprising cellulose fibers and having a first surface (14) and a second surface, opposite to the first surface;
  b) dipping the paper film into a solution comprising at least one additive selected from the group comprising 4-fluorophenethyl isocyanate, 2-2 diphenylethyl isocyanate, nitrophenyl isocyanate, 1-adamantyl isocyanate, cyano-phenyl isocyanate, and triphenylamine;
  c) grafting the additive to the cellulose fibers; and
  d) forming a first electrode on the first surface and a second electrode on the second surface.

8. The method of claim 7, wherein step c) comprises exposing the paper film to pulses of an ultraviolet radiation.

9. The method of claim 8, wherein the pulses have a duration in the range from 0.5 to 2 ms and an energy fluence in the range from 5 to 20 J/cm2.

10. The method of claim 7, further comprising the steps of:
  e) forming a layer comprising a solvent and polyvinylidene fluoride and/or at least one copolymer of polyvinylidene fluoride, particularly a polymer selected from the group comprising polyvinylidene fluoride, poly(vinylidene fluoride-tri fluoro ethylene), poly(vinylidene fluoride-tetra fluoro ethylene), and a mixture of at least two of these polymers; and
  f) exposing the layer to pulses of an ultraviolet radiation.

* * * * *